United States Patent [19]

Fischer et al.

[11] Patent Number: 5,055,875
[45] Date of Patent: Oct. 8, 1991

[54] DEVICE FOR PRODUCING PRINTING PLATES

[75] Inventors: Hermann Fischer, Augsburg; Jan Nemcik, Bad Salzuflen, both of Fed. Rep. of Germany

[73] Assignee: Krause-Biagosch GmbH, Bielefeld, Fed. Rep. of Germany

[21] Appl. No.: 604,062

[22] Filed: Oct. 26, 1990

[30] Foreign Application Priority Data

Nov. 10, 1989 [DE] Fed. Rep. of Germany ....... 3937557

[51] Int. Cl.⁵ .............................................. G03B 27/04
[52] U.S. Cl. ....................................... 355/89; 355/85; 355/87
[58] Field of Search ........................ 355/85, 86, 87, 88, 355/89

[56] References Cited

U.S. PATENT DOCUMENTS

| | | | |
|---|---|---|---|
| 3,409,363 | 11/1968 | Matthaes | 355/87 |
| 3,689,153 | 9/1972 | Suzuki | 355/89 |
| 4,389,117 | 6/1983 | Floyd et al. | 355/87 |

*Primary Examiner*—Monroe H. Hayes
*Attorney, Agent, or Firm*—Collard, Roe & Galgano

[57] ABSTRACT

In the context of a device for producing printing plates comprising a printing down station with a plate table and an associated illuminating means, which station has associated with it a foil receiving means formed preferably constituted by a foil cassette for unprinted foil and preferably at least one receiving cassette for printed foil, in the case of which the foil to be printed onto an unexposed or blank printing plate is able to be taken from a foil receiving means by means of a moving vacuum frame, is able to be moved onto the blank plate on the plate table and after exposure is able to be discharged, preferably into a receiving cassette, a higher throughput rate and a gentle handling of the foils etc. with a high standard of accuracy are possible by the provision of a plurality of vaccuum frames, of which at least two are attached to the periphery of at least one frame carrier, which is able to be turned through the angle between the vacuum frames, such attachment being a points which are offset from each other by the length of the path between the at least one foil receiving device and the plate table.

23 Claims, 3 Drawing Sheets

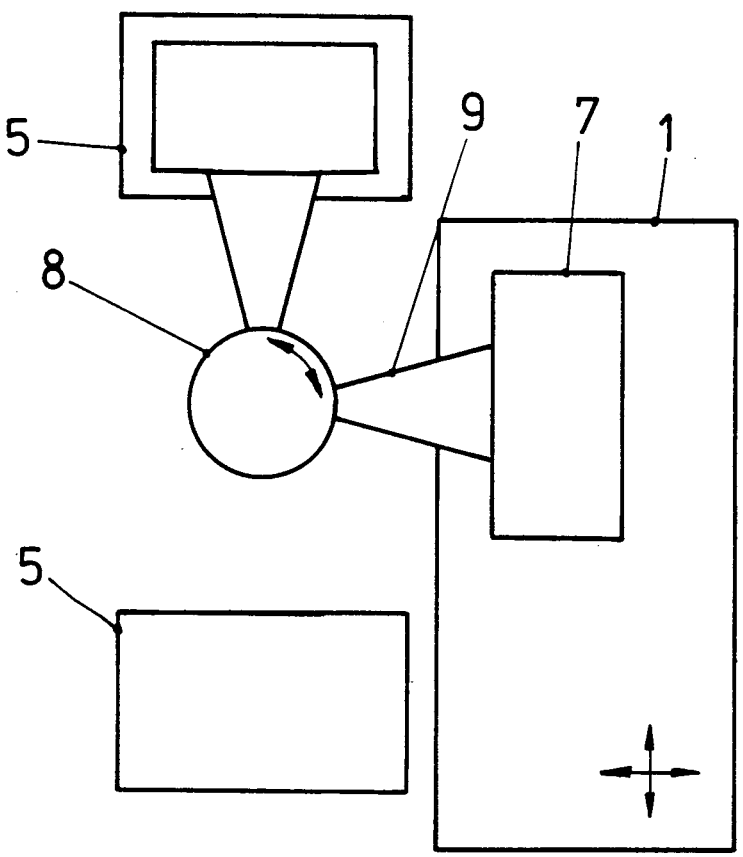

DEVICE FOR PRODUCING PRINTING PLATES

BACKGROUND OF THE INVENTION

The invention relates to a device for producing printing plates comprising a printing down station with a plate table and an associated illuminating means, which station has associated with it a foil containing means preferably constituted by a foil cassette for unprinted foil and preferably at least one receiving cassette for printed foil, in the case of which the foil to be printed onto an unexposed or blank printing plate is able to be taken from a foil containing means by means of a moving vacuum frame, is able to be moved onto the blank plate on the plate table and after exposure is able to be discharged, preferably into a receiving cassette.

A device of this type is described in the German utility model publication 8,813,594 U. In this known device there is a vacuum frame which straddles the plate table and is only able to be moved vertically so that it may be used for unloading from a laterally insertable cassette and loading a laterally insertable receiving cassette as the cassette is moved under it. In order to achieve the necessary accurate register it is necessary for the vacuum frame to be indexed in relation to the foil cassette by locating pins. The same applies in relation to the plate table. All this not only makes the device slow in operation so that the hourly output rate is low, but also necessarily leads to wear and thus inaccurate operation. A further point is that the known device runs with comparatively long intervals between the consecutive printing down operations, because when only one vacuum frame is employed there is no overlap in time of the individual working steps. Another point is that in the known apparatus the speed at which the laterally inserted cassettes are moved is restricted in order to reduce noise and wear and thus to increase reliability.

SHORT SUMMARY OF THE PRESENT INVENTION

Accordingly one object of the present invention is to so improve a device of the initially noted type with simple and economic means that a high throughput rate is possible.

Yet another object of the invention is to ensure gentle handling and reliable operation.

Another aim is to achieve a high degree of accuracy.

In order to achieve these or other objects appearing from the present specification, claims and drawings, in the present invention the device comprises a plurality of vacuum frames, of which at least two are attached to the periphery of at least one frame carrier, which is able to be turned through the angle between the vacuum frames, such attachment being at points which are offset from each other by the length of the path between the at least one foil receiving means and the plate table.

These measures in accordance with the invention overcome the drawbacks of the prior art noted completely. Owing to the fact that the vacuum frames are attached to the frame carrier there is the advantage of not only making a higher speed of operation possible but also of being able to dispense with any setting in register at the end positions. In fact, the invention makes it possible merely to have abutments. For both these reasons there is a not inconsiderable increase in the possible output rate. A further increase in the output rate is due to the fact that the loading and unloading events (which represent idle time) may be timed to coincide with each other and with the printing down operation, since the vacuum frame is loaded or unloaded and the foil one the other vacuum frame is printed down and vice versa. The printing down operations, which are performed using the vacuum frames alternately may therefore take place in rapid succession. However there is nevertheless a comparatively long time available for the conveying operations as such so that the kinetic events take place quietly at a speed which ensures reliability and also a low wear rate. Since the vacuum frames are not brought into register there is the advantage of a very simple mechanical design and gentle handling with the advantage of a long trouble-free working life with a constantly high standard of accuracy.

In accordance with a further a further possible development of the invention the frame carrier may be constituted by a member able to be pivoted or rotated about its own axis and which has radially projecting arms each bearing a vacuum frame. These measures lead to the useful advantage to a carousel-like frame carrier, which despite an extremely simple design leads to highly accurate operation and a high speed of motion. A further advantage is to be seen in the fact that in this case the frames extending from the frame carrier are able to be simply and easily cleaned in a position between the working positions adjacent to the foil cassette and, respectively, the plate table.

A further possible feature of the invention is such that the frame carrier may be constituted by a rotatable rotor, which is mounted on a stand or is itself in the form of a rotatable stand. Such a rotor may be not only rotated but readily moved in the z direction and if this should be desired in the x and, respectively, y direction as well. By dint of motion in the z direction a pair of vacuum frames is moved down simultaneously onto the plate table and, respectively, the foil cassette.

It is convenient if the foil cassette is able to be moved parallel to the axis of the stand by a distance at least equal to the height of the stack of pieces of foil able to be received in it. This enables a simple allowance to be made for the decrease in the height of the stack of such items of foil In keeping with yet another possible advantageous form of the invention the frame carrier may be in the form of a drum able to be turned about a horizontal axis. In this connection the illuminating device may simply arranged in the center of the drum, this leading to a very compact arrangement.

It is an advantage if the frame carrier is able to be driven in the reverse and forward directions between two preferably adjustable abutment positions with a pivoting motion. This measure makes possible the simple supply of vacuum to the vacuum frames by means of permanently connected hose.

In accordance with a further a further possible development of the invention it is possible to have a plurality of frame sets which are mounted on the frame carrier and are used alternately, such sets having a plurality of, and more particularly two vacuum frames, each frame set being for a particular frame size. These measures ensure that even in the case of a change in the foil format the complex process, so far required, of frame changing is no longer necessary; this leads to the useful advantage that the production rate is enhanced. A further advantage is to be seen in the fact that in this case the amount of power and time required for establishing the requisite vacuum level is optimized in each case; this leads to the useful advantage of improved throughput rates. In fact printing down with a smaller frame requires less build up of vacuum than printing down with a larger frame and thus it needs a smaller amount of power and less time for establishing the working vacuum level.

Further features and advantages of the invention will be grathered from the ensuing detailed description of embodiments thereof referring to the drawings.

LIST OF THE SEVERAL VIEWS OF THE DRAWINGS

FIG. 5 is a plan view of a further working embodiment.

DETAILED DESCRIPTION OF WORKING EMBODIMENTS OF THE INVENTION

Figure 1:
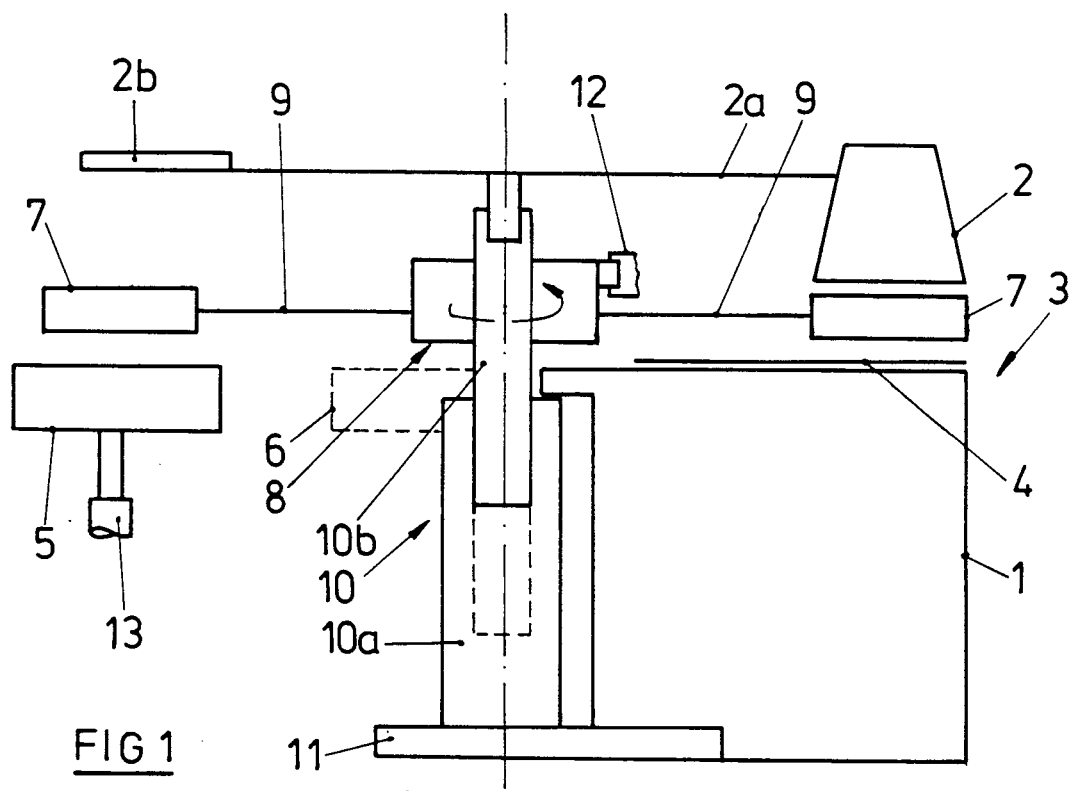
FIG. 1 is a view of an automatic printing down or contact printing device in accordance with the invention for the production of printing plates with two vacuum frames mounted on a pivoting rotor.

The automatic printing down or contact printing device for the production of printing plates as shown in FIG. 1 comprises a plate table 1 which is spanned by an illuminating device 2 with which it forms a printing down station 3. The plate table 1 is provided with holding means for a blank or as yet unexposed plate 4 able to be mounted thereon and, as indicated by the arrows, is able to be moved in the x and y directions so that motion into a plurality of positions is possible, in which a respective item of foil may be printed down onto the blank plate 4, i.e. the image of such foil copied onto the plate 4.

Associated with the plate table 1 there is a foil cassette 5, in which the items of foil to be printed down onto the blank are contained and a receiving or empty cassette 6 to receive the printing down foils. The foil cassette 5 is arranged clear of the plate table 1, that is to say in the present case opposite to the table. The receiving foil cassette 6 is located approximately half way between the plate table 1 and the foil cassette 5. It would also be possible to leave the printed down foil on the printing plate which has been produced. In this case it would then be possible to dispense with the receiving foil cassette 6 provided in the present design. This would more particularly be the case for the production of printing plates to presses for newspaper production, in the case of which only one foil is required for each plate.

The foils are each conveyed by means of a transparent vacuum frame 7, which may be put under vacuum, from the foil cassette 5, which contains a stack of foils, to the plate table 1 and then lowered onto the blank plate 4, and after exposure by means of the illuminating device they are dumped in the receiving foil cassette 6. The device illustrated comprises two identical vacuum frames 7, which are run along a track, in the present case a circular one. For this purpose the vacuum frames 7 are secured to a common rotatably arranged frame carrier 8 which is able to be turned about its axis in the direction of rotation. The mutual offset of the vacuum frames 7 about the periphery of the frame carrier 8 is equal to the mutual offset between the plate table 1 and the foil cassette 5 and in the present case accordingly amounts to 180°. However it would be readily possible to have a smaller angle of offset of preferably 90° in order to keep the distance moved between the foil cassette 5 and plate table 1 as short as possible. In the case of such an arrangement it would also be possible to have two foil cassettes offset by 180° in relation to each other to which one respectively associated vacuum frame is moved alternately, as will be seen from FIG. 5.

In any event this makes sure that in each case one vacuum frame 7 is located in the vicinity of the foil cassette 5, when the other vacuum frame 7 is in the vicinity of the plate table 1 and vice versa. Thus it is possible for the one vacuum frame 7 to already take a foil from the foil cassette 5, while the other foil taken by the other vacuum frame 7 is being printed down onto the blank plate 3. This phase offset of the two circuits in which the foil is moved leads to a high production rate.

In the illustrated working embodiment of FIG. 1 the frame carrier 8 is constituted by a rotor turning about a vertical axis, which is provided with radially projecting, and in the present case diametrically opposite, arms 9, on which a respective vacuum frame 7 is secured. The rotor with the vacuum frames 7 is in the present case rotatably mounted on a stand 10, and is provided with a rotary drive means. In lieu of a rotor mounted on the stand 10 for the vacuum frames 7 it would also be possible for the stand 10 to be a rotary stand and for the vacuum frames 7 to be fixed thereto.

For the simultaneous lowering of the two vacuum frames 7 onto the foil cassette 5 and, respectively, onto the plate table 1 the frame carrier 8 is arranged or designed so that it may be adjusted in a direction parallel to its vertical axis. In the illustrated working embodiment the stand 10, which carries the frame carrier 8, is of telescopic construction and its lower part 10a is attached to a platform 11 and its upper part 10b, mounted in the lower part 10a, may be turned in relation to the stationary lower part 10a and may be moved inwards and outwards in the axial direction. The possibility of motion parallel to the axis corresponds to the distance between the vacuum frames 7 in their upper position and the plate table 1 and, respectively, the blank plate 4 on the table so that the vacuum frame 7 adjacent to the table may be fully lowered onto the blank plate 3 by motion of the frame carrier 8 parallel to the axis. In the case of single piece rotary stand of the above mentioned type it would be possible for the vacuum frames 7 to be arranged so that they could move upwards and downwards in relation to the rotary stand on which they are mounted.

The foil cassette 5 may be so arranged that its upper edge is approximately at the same level as the surface of the plate table 1. Since the stack of foil in the foil cassette 5 is however processed and the stack therefore decreases in height, an additional movement is required in order to compensate or allow for this decrease in the height of the stack. In the illustrated working embodiment for this purpose the foil cassette 5 is to be able to be suitably raised in level, as is indicated by a lifting means 13. However, it would be readily possible to suitably lower the vacuum frame 7 on the foil cassette side in relation to the frame carrier 8.

The rotary drive for the frame carrier 8, which may be in the form of a positioning motor, may be arranged on the carrier, this being indicated in FIG. 1 by a box structure. The rotary drive of the frame carrier 8 may in this respect be such that there is a gyratory rotary motion, which naturally takes place in steps corresponding to the angular spacing between the plate table 1 and the foil cassette 5. In the illustrated working embodiment the frame carrier 8 is respectively moved through the said angle backwards and forwards that is to say oscillated or angularly reversed. This ensures that the vacuum hose running to the vacuum frames 7 but not shown in the present case is not able to excessively turned and therefore do not have to be disconnected. In the case of there being a continuous rotary motion this would have to be made possible by a rotary vacuum connector or leadthrough allowing connection between two relatively rotating parts.

The end positions of the said pivotal motion of the frame carrier 8 are set by adjustable abutments 12. In such abutment settings respectively one foil is taken from the foil cassette 5 and lowered down onto the blank plate 3. On the path between the abutment settings the last foil to be printed down onto the blank plate 3 is ejected into the receiving foil cassette 6 as it moves past same. This may take place without any dwell of the parts but it would also be possible to cause a short dwell in the rotary motion of the frame carrier 8. The transparent vacuum frames 7 have to be cleaned from time to time. For this purpose the frame carrier 8 is simply parked in an intermediate position between its abutment settings, in which the vacuum frames 7 are readily accessible.

The illumination device 2 may be attached to the ceiling of the room. In the present case the illuminating device 2 is mounted on a boom 2a, which for its part is mounted by means of a turning pin on the stand 10 or, respectively, it telescoping upper part 10b so that the device 2 is able to turn about the pin and is only locked so that it is not able to turn. The boom 2a makes possible simple adjustment of the illuminating device 2. In order to simplify the bearing system it is possible for the boom 2a to be in the form of a double boom, i.e. a boom with two arms with a counterweight 26 on the boom opposite to the boom with the illuminating device.

The automatic printing down device depicted in FIG. 1 may be seen from the figure to have only a few subassemblies which may be readily adjusted and set in relation to each other, this making possible simple shipping and simple assembly at the point of use. Thus the plate table 1 runs on the platform 11. The telescoping upper part 10b runs on the telescoping lower part 10a mounted on the platform 11, and for this purpose the lower part 10b is in the form of cylinder. The boom 2a comprising the illuminating device 2 and the rotor with the vacuum frames 7 (in the form of the frame carrier 8 with the means for turning it) are mounted on the telescoping upper part 10b, which is in the form of a cylinder. These subassemblies may be separated shipped and quickly and reliably put together on site.

In the illustrated working embodiment the vacuum frames 7 are also to be able to be adjusted independently from each other in relation to the frame carrier 8 in a manner parallel to the axis of the stand. For this purpose it is possible to use the vacuum frame 7 on the foil cassette side to impart a shaking motion for shaking off any further foil sticking to the aspirated foil. This furthermore makes possible a particularly precise and full engagement of the foil on the blank plate 3. In order to ensure a simple method of lateral adjustment of the vacuum frames 7 the arms 9 may be in the form of extendible or retractable telescoping arms. In this case as well it is possible to have abutments which are preferably adjustable. A further aid for adjustment may be one in which the rotary stand forming the frame carrier 8 is able to be adjusted in the x and in the y direction. For this purpose the platform 11 may be arranged to be slid in a suitable manner.

Figure 2:
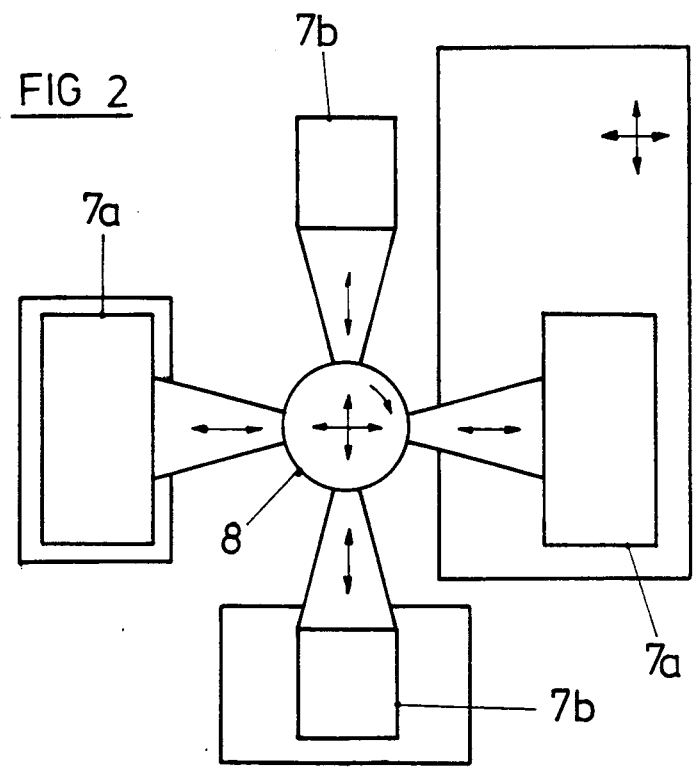
FIG. 2 is a plan view of an automatic printing down device in accordance with the invention whose two frame sets have different sized vacuum frames.

In the illustrated working embodiment of FIG. 2 there is the departure from the designs described so far that, more particularly, there are four vacuum frames 7a and 7b, which are in two pairs with the members of each pair being equal in size. The vacuum frames 7a and, respectively, 7b in the pairs of equal size are arranged so as to be diametrally opposite to each other. The respectively larger vacuum frames 7a and, respectively, 7b each form a frame set. The vacuum frames 7a of the one frame set may for instance be of A4 format and the vacuum frames 7b of the other frame set may be of A5 format. It would obviously be possible to have more than two frame sets. One respective frame set is in use at a time. This makes it possible to handle foils of different size directly one after the other without any change of frame. For this purpose all that is required is for the frame carrier 8 to be swiveled through an angle equal to the mutual offset of the respective frames sets, i.e. in the illustrated working embodiment through 90°. In all other respects the structure and workings of this device are the same as to those of the arrangement of FIG. 1.

Figure 3:
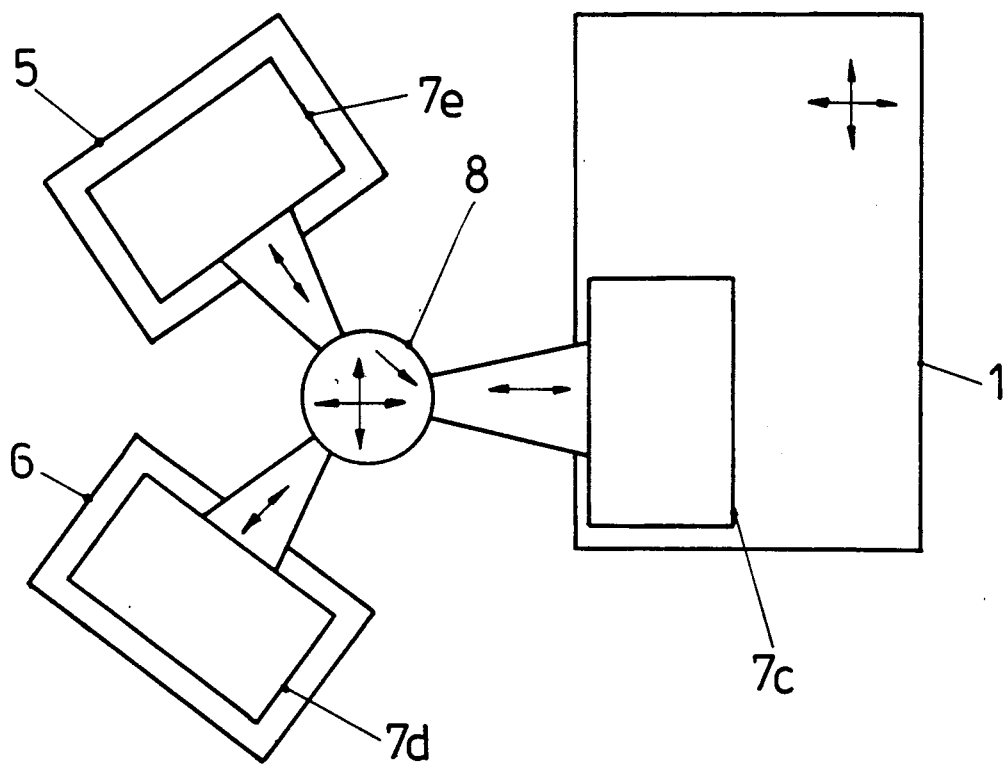
FIG. 3 is a plan view of a printing down device in accordance with the invention with three vacuum frames.

In the illustrated working embodiment of FIG. 3 the essential departure from the arrangement in accordance with FIG. 1 is that the frame set used here has three vacuum frames 7c, 7c and 7e, which are arranged with an equal annular offset, in the present case 120°, about the rotary stand forming the frame carrier 8. In a like manner the plate table 1, the foil cassette 5 and the receiving foil cassette are arranged with a mutual offset about the axis of the frame carrier in the form of a circular transport path. The rotation of the frame carrier 8 in this case is in one direction. The supply of vacuum to the vacuum frames 7c, 7d and 7e is in this case by way of a rotary transmission (leadthrough) and preferably via ducts fixed to the frame carrier. The rotation takes place in steps corresponding to the angular spacing of the vacuum frames 7 so that there are the following respective associations of parts: one vacuum frame, that is to say, 7c is adjacent to the plate table 1, a further vacuum frame, that is to say 7d, is adjacent to the receiving foil cassette and a further vacuum frame, that is to say 7e, is adjacent to the foil cassette 5. In this arrangement there is accordingly an automatic ejection of the respectively printed down foil into the receiving foil cassette 6 when stationary.

In other respects the mechanical design and workings may be the same as in the illustrated working embodiment of FIG. 1. It would also be possible, like the arrangement in accordance with 2, to provide more than one set of frames with three respective vacuum frames, it being possible for each frame set to have different sized frames therein.

Figure 4:
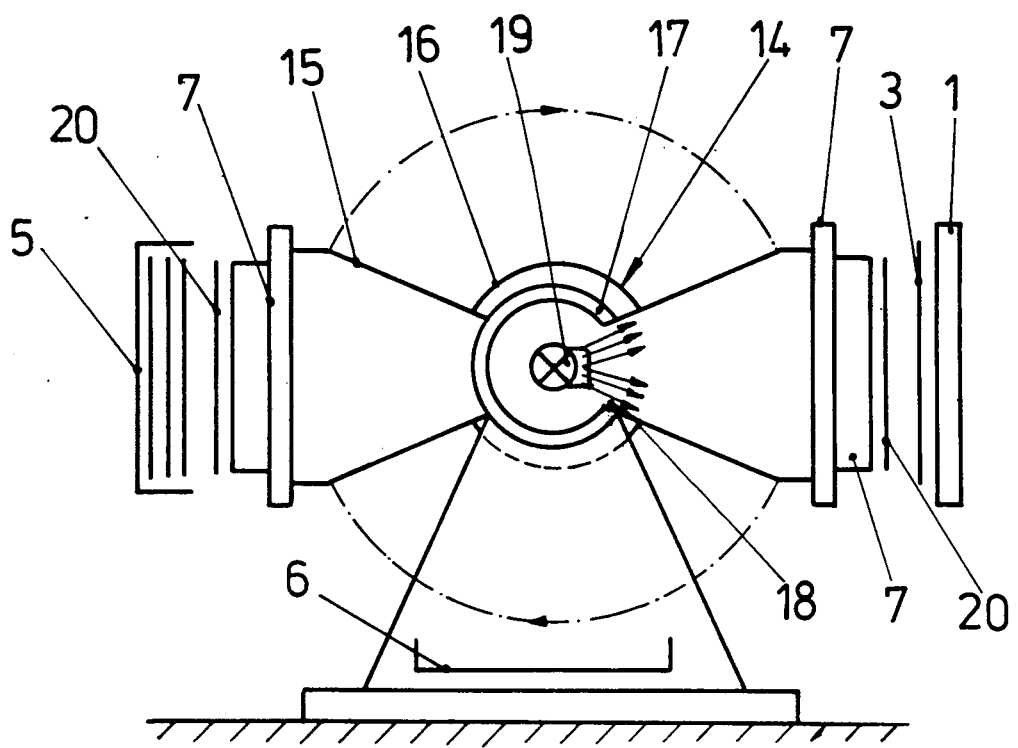
FIG. 4 is a view of an automatic printing down device in accordance with the invention with vacuum frames mounted on a horizontally placed drum.

In the illustrated working embodiment of FIG. 4 there are, as in the arrangement in accordance with FIG. 1, two vacuum frames 7, which are arranged to orbit along a circular path. The frame carrier is in this case constituted by a drum 14 able to rotate about a horizontal axis, which is arranged in the part between the plate table 1 (in the present case arranged so that the table axis is vertical) and the foil cassette 6 arranged so that the plane of its floor is vertical, said drum having a receiving foil cassette 6 thereunder. The plate table 1 and the foil cassette 5 are placed diametrally opposite to each other in relation to the drum axis. Furthermore, the two vacuum frames 7 provided here are arranged diametrally opposite to each other. The drum 14 is made up of two passages 15, which respectively bear a vacuum frame 7, form radially outwardly diverging arms and are connected with each other by lateral rings 16, which are bearinged on a central shaft 17. The passages 15 respectively extend as far as the shaft 17, which is hollow and has a window 18 directed towards the plate table 1. The illuminating device 19 is accommodated in the tubular shaft; as soon as the inwardly opening cross section of a passage 15 is in a position overlapping the window 18, illumination of the foil 20 placed on the vacuum frame 7 turned towards the plate table 1 is possible, such foil 20 being able to be contact printed onto the blank plate 3 secured to the plate table 1. The plate table 1 and the foil cassette 5 are, as already mentioned, arranged with the same angular offset as the vacuum frame 7 so that there is on the one side a printing down operation and on the other side there is the removal of a new foil 20 from the foil cassette 5. By turning the drum through the annular offset in the present case of 180°, there is an exchange of positions of the vacuum frames 7, the vacuum frame 7 carrying the printed down foil being cut off from the vacuum on moving past the receiving foil cassette 6, such foil then being dropped or ejected into the said receiving foil cassette 6.

The vacuum frames 7 are also arranged so as to be fixed in relation to the drum. The plate table 1 and the foil cassettes 5 may in this design be arranged to be set on the drum so as to be perpendicular the plane of the table and, respectively, of the foil cassette bottom. However, it would also be possible to design the passages 15 so as to telescope in order to be able to cooperatingly connect the vacuum frames 7 with the plate table 1 and, respectively, the foil cassette 5, which in this case would not have to be moved for adjustment.

Basically the design of the arrangement in accordance with 5 is the same as of the arrangement of the FIG. 1 but with the difference that, as already mentioned, the vacuum frames 7 and the arms 9 carrying same are arranged on the periphery of the associated frame carrier 8 (which in the present case is able to pivot about a vertical axis) with an offset between them. The same arrangement would also be possible if the pivot axis of the frame carrier were horizontal. Adjacent to the plate table 1 there are in the present case two foil cassettes 5, which are placed opposite to each in relation to the frame carrier 8 that is to say with an angle of 180° between them, and which may be alternately be approached by one vacuum frame 7. For this purpose the frame carrier 8 may only be pivoted through respectively 90° backwards and forwards. This means that there are particularly short displacements and duty cycles.

In lieu of the foil cassettes 5 it would also be possible to have foil support platforms with locating or register pins similar to a foil cassette, which for their part would be able to be loaded by means of a server from a common cassette. It would equally be possible to have a single foil cassette adapted to reciprocate between the two foil transfer positions in place of two foil cassettes.

We claim:

1. A device for producing printing plates comprising a printing down station with a plate table and an associated illuminating means, which station has associated with it a foil receiving means formed preferably constituted by a foil cassette for unprinted foil and preferably at least one receiving cassette for unprinted foil, in the case of which the foil to be printed onto an unexposed or blank printing plate is able to be taken from a foil receiving means by means of a moving vacuum frame, is able to be moved onto the blank plate on the plate table and after exposure is able to be discharged, preferably into a receiving cassette, said device comprising a plurality of vacuum frames, of which at least two are respectively attached to the periphery of at least one frame carrier, which is able to be turned through the angle between the vacuum frames, such attachment being at points which are offset from each other by the length of the path between the at least one foil receiving means and the plate table.

2. The device as claimed in claim 1, wherein the frame carrier is constituted by a member able to be turned or pivoted about an axis thereof and which includes radially projecting arms each bearing a vacuum frame.

3. The device as claimed in claim 2, wherein the frame carrier is constituted by a rotor able to be turned or pivoted about a vertical axis.

4. The device as claimed in claim 3, wherein the frame carrier is able to be shifted parallel to its own axis at least through an angle equal to the angular distance between the vacuum frame and the plate table.

5. the device as claimed in claim 1, wherein the rotor is mounted on a stand, said stand being preferably telescopic in design.

6. The device as claimed in claim 1, wherein the illuminating device is located on a stand associated with the vacuum frame by means of boom which preferably bears a counterweight.

7. The device as claimed in claim 1, wherein the foil cassette is able to be adjusted in position through a distance at least equal to the height of the stack of foil therein, such adjustment movement being parallel to a bottom of the foil cassette.

8. The device as claimed in claim 1, wherein the vacuum frames are able to be moved, preferably in a manner independent from each other, in relation to the frame carrier while remaining parallel to the surface of the frame.

9. The device as claimed in claim 2, wherein the arms bearing the vacuum frames are able to be extended and retracted telescopically, preferably as far as adjustable abutments.

10. The device as claimed in claim 1, wherein the frame carrier is able to be moved for adjustment parallel to the surface of the plate table.

11. The device as claimed in claim 1, wherein the plate table is able to be moved for adjustment while remaining parallel to the table area thereof.

12. The device as claimed in claim 1, comprising reversing drive means for reciprocating the frame carrier between two preferably adjustable abutment settings.

13. The device as claimed in claim 1, wherein the receiving foil cassette is arranged in the path of pivoting of the frame carrier between the plate table and the foil cassette.

14. The device as claimed in claim 1, wherein the frame carrier is constituted by a drum adapted to turn abut a horizontal axis, under which drum the receiving cassette is arranged and which is flanked by the foil cassette and the plate table, which are arranged so that the bottom of the former and the plane of the latter are both vertical.

15. The device as claimed in claim 13, wherein the plate table and the foil cassette are able to be set on the respectively opposite vacuum frame so as to be perpendicularly set to the plane of the table and, respectively, of the bottom.

16. The device as claimed in claim 13, wherein the drum is mounted on a stationary tubular shaft which has an illuminating window opposite to the plate table and comprises an illuminating device within it.

17. The device as claimed in claim 13, wherein the radially extending arms, which bear the vacuum frames, of the drum are constituted by illumination passages which become wider in an outward direction and extend as far as the tubular shaft.

18. The device as claimed in claim 1, comprising a plurality of frame sets mounted on the frame carrier and each comprising a plurality of vacuum frames, each frame set corresponding to a particular frame size.

19. The device as claimed in claim 17, comprising two such frame sets of which one preferably comprises a vacuum frame for A4 paper format and the other comprises a vacuum frame for A5 paper format.

20. The device as claimed in claim 17, wherein for each such frame set there are two vacuum frames which are preferably arranged diametrally opposite to each other.

21. The device as claimed in claim 17, comprising more than two such vacuum frames and more particularly three vacuum frames associated with each frame set, such vacuum frames being equally spaced apart.

22. The device as claimed in claim 20, wherein the frame carrier, preferably having more than two vacuum frames associated with each frame set, is able to be driven in one direction in the direction of rotation.

23. The device as claimed in claim 1, wherein said frame carrier bears at least to vacuum frames offset by 90° in relation to each other, and preferably two foil receiving means or foil cassettes are provided opposite to each other in relation to the frame carrier, said foil receiving means or, respectively, said foil cassettes being able to be alternately approached by a vacuum frame.

* * * * *